United States Patent
Roberts

(10) Patent No.: US 6,842,888 B2
(45) Date of Patent: *Jan. 11, 2005

(54) METHOD AND APPARATUS FOR HIERARCHICALLY RESTRUCTURING PORTIONS OF A HIERARCHICAL DATABASE BASED ON SELECTED ATTRIBUTES

(75) Inventor: James T. Roberts, Austin, TX (US)

(73) Assignee: Freescale Semiconductor, Inc., Austin, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 10/127,910

(22) Filed: Apr. 23, 2002

(65) Prior Publication Data

US 2003/0200522 A1 Oct. 23, 2003

(51) Int. Cl.⁷ .................. G06F 17/50; G06F 19/00
(52) U.S. Cl. .................. 716/18; 716/3; 716/17
(58) Field of Search .................. 716/1–3, 7–12, 716/16–18

(56) References Cited

U.S. PATENT DOCUMENTS

| | | |
|---|---|---|
| 5,247,468 A | 9/1993 | Henrichs et al. |
| 5,262,959 A | 11/1993 | Chkoreff |
| 5,548,524 A | 8/1996 | Hernandez et al. |
| 5,604,680 A | 2/1997 | Bamji et al. |
| 5,625,564 A | 4/1997 | Rogoyski |
| 5,682,519 A | 10/1997 | Saldanha et al. |
| 5,790,416 A * | 8/1998 | Norton et al. ......... 716/11 |
| 5,805,860 A | 9/1998 | Parham |
| 5,815,402 A | 9/1998 | Taylor et al. |
| 5,946,218 A | 8/1999 | Taylor et al. |
| 6,011,911 A * | 1/2000 | Ho et al. ......... 716/5 |
| 6,026,226 A | 2/2000 | Heile et al. |
| 6,080,204 A * | 6/2000 | Mendel ......... 716/7 |
| 6,170,080 B1 * | 1/2001 | Ginetti et al. ......... 716/18 |
| 6,237,133 B1 * | 5/2001 | Suzuki ......... 716/19 |
| 6,272,671 B1 * | 8/2001 | Fakhry ......... 716/18 |
| 2002/0023255 A1 | 2/2002 | Karniewicz |

* cited by examiner

Primary Examiner—Vuthe Siek
Assistant Examiner—Paul Dinh
(74) Attorney, Agent, or Firm—Susan C. Hill

(57) ABSTRACT

A method and apparatus for hierarchically restructuring at least a portion of a hierarchical database based on selected attributes. In one embodiment, a virtual cell (140) may use a virtual cell mapping function (130) to create a hierarchical netlist. Some embodiments may programmatically create a corresponding generated template to include in the netlist for each virtual cell. Some embodiments may generate multiple templates from the same cell. Some embodiments may generate multiple instances of different templates from the same instance in the database. One application of the present invention is for use in circuit simulation.

13 Claims, 9 Drawing Sheets

METHOD AND APPARATUS FOR HIERARCHICALLY RESTRUCTURING PORTIONS OF A HIERARCHICAL DATABASE BASED ON SELECTED ATTRIBUTES

FIELD OF THE INVENTION

The present invention relates generally to hierarchical databases, and more particularly to hierarchically restructuring portions of a hierarchical database.

BACKGROUND OF THE INVENTION

Traditional hierarchical databases have always assumed a fixed one-to-many relationship between a parent cell and what children it has. As hierarchical databases have gotten larger and more complex with an increased number of children it has become problematic to represent different children as a separate cell in the database.

BRIEF DESCRIPTION OF THE DRAWINGS

The present invention is illustrated by way of example and is not limited to the embodiments illustrated in the accompanying figures, in which like references indicate similar elements.

DETAILED DESCRIPTION

Figure 11:
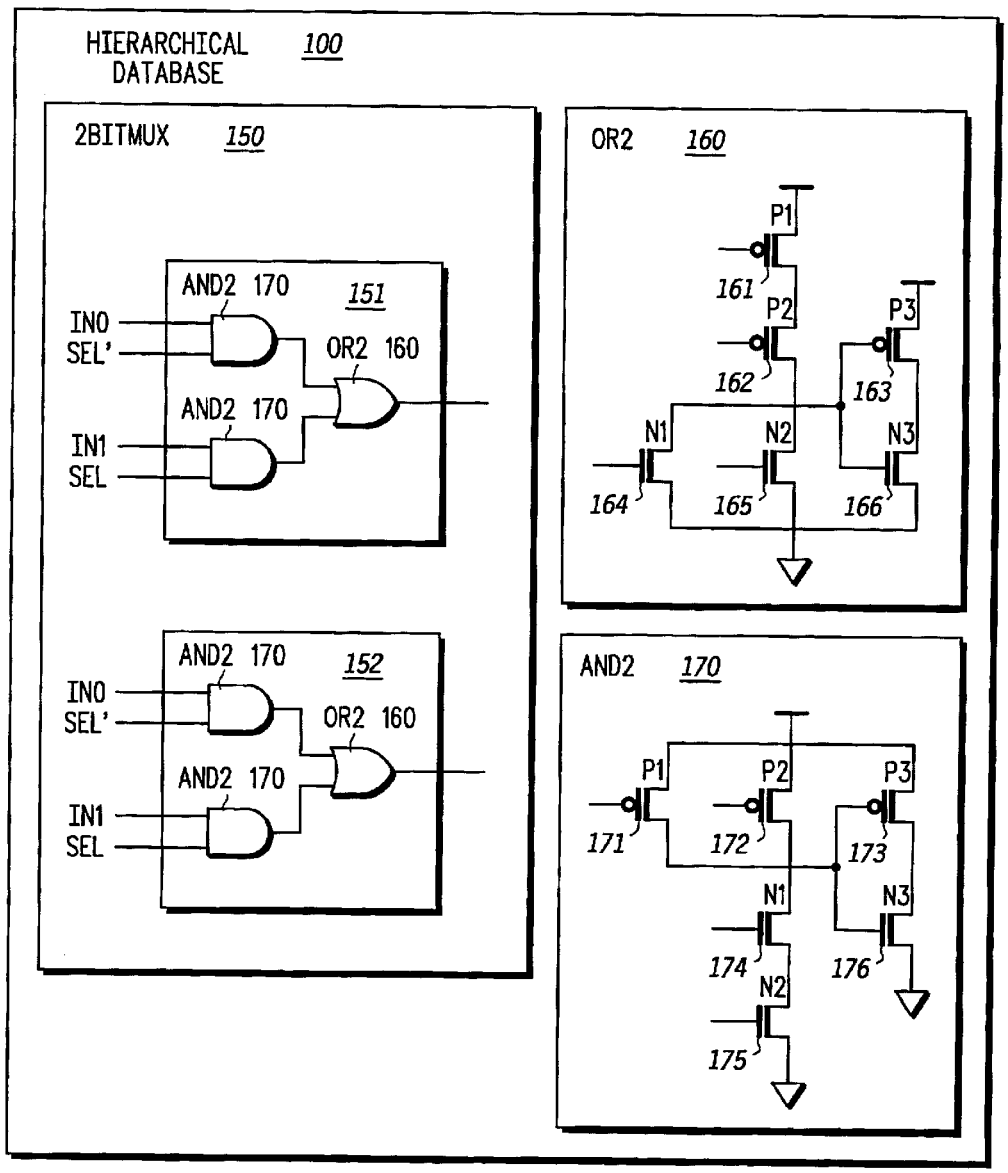
FIG. 11 illustrates, in block diagram form, one embodiment of a hierarchical database containing the sample "2BITMUX" circuit of FIG. 8 in accordance with the present invention.

FIG. 11 represents one possible embodiment of a hierarchical database containing a hypothetical cell 2BITMUX 150. 2BITMUX 150 contains two references, 151 and 152, to another cell MUX2, which also resides in the hierarchical database. The cell MUX2, in turn, contains references to cells or2 160 and and2 170, which in turn contain many references to the cells nmos and pmos. These references, when all put together, form a hierarchical tree 100, as illustrated in the top half of FIG. 8. Current hierarchical netlisters, regardless of the circuit or application, have to descend and netlist this hierarchical tree. The netister may either traverse the hierarchical tree and netlist it concurrently, or it may traverse the entire hierarchy first, building a one-dimensional list and then going back and netlisting every item in that list. Although both methods result in the same output, the latter embodiment will be shown here. For the cell 2BITMUX 101, in FIG. 8, a traditional netlister would find every unique cell in the tree and construct a list such as the following:

("nmos", "pmos", "and2", "or2", "MUX2", "2BITMUX")

Every unique cell in the hierarchy 101–108 appears exactly once in the list. Note that duplicates of the same cell, such as pmos 104 and pmos 107, result in only one pmos in the list. Likewise for nmos 105 and nmos 108. Once the hierarchy is traversed and the list completed, a traditional netlist would then appropriately netlist each cell in the list.

The pseudocode to perform a prefix traversal of the hierarchical database 100 and to construct this list consists of a recursive function which adds the top-level cell to the list and recursively descends the hierarchy, adding unique child cells to the list as it goes:

```
Recursive Function BuildList(topcell)
    Add topcell to list.
    foreach unique cell type in topcell
        if cell is not already in the list then
            BuildList(cell)
        endif
    end foreach
endFunction
```

To further analyze the problem, assume that all of the nmos transistors in the first MUX2 151 have width 2, and those in the second MUX2 152 have width 3. To do this, a "width" attribute must first be assigned to the nmos cells 164–166 and 174–176, which can be changed on an instance-by-instance basis. Furthermore, the nmos instances must be able to inherit their "width" attributes from their parent cells 160 and 170, and ultimately from the MUX2 102 cell itself, or it will not be possible to simultaneously represent nmos transistors of different widths from different instances of the same MUX2 102 cell. In the prior art, children are allowed to inherit attributes from their parent cells. Note in FIG. 11 that the nmos transistors 174, 175, and 176 can have an attribute "width" equal a second attribute "w_and" (width=w_and) on the parent cell and2 170; and in turn, the and2 instances in MUX2 151 and 152 have the attribute "w_and=w_mux". This attribute inheritance allows the "width" attribute of the nmos devices ultimately to be determined by the "w_mux" attribute, which is set on the instances 151 and 152 of MUX2 itself. In the 2BITMUX 150 schematic, MUX2 151 may set its "w_mux" attribute to 2, whereas MUX2 152 may set its "w_mux" attribute to 3. Thus the ability to set different width attributes to different instances of nmos, further down the hierarchy, is conveyed.

Prior art, however, has not conveyed the ability to change the hierarchy itself based on attributes on the instances. For example, suppose the instances MUX2 151 and MUX2 152 required entirely separate and distinct "nmos" and "nmos_depletion" cells underneath their hierarchy, instead of merely different attributes on the same nmos cell. This situation might arise, and has arisen, when applications (FIG. 6, 86–89) which read the netlist (FIG. 6, 83–85) require separate enhancement-mode N devices and depletion-mode N devices. By contrast, the hierarchical database 80 may only need, or even require, like instances of "nmos" as before, but with a "mode=enhancement" or "mode=depletion" attribute differentiating them.

An example follows demonstrating the problem using well-known syntax:

Database 80:
.model nmos width=float mode=(enhancement or depletion) [etc . . . .]

Netlist 83:
.model nmos width=float [etc . . . .]
.model nmos_depletion width=float [etc . . . .]

Figure 8:
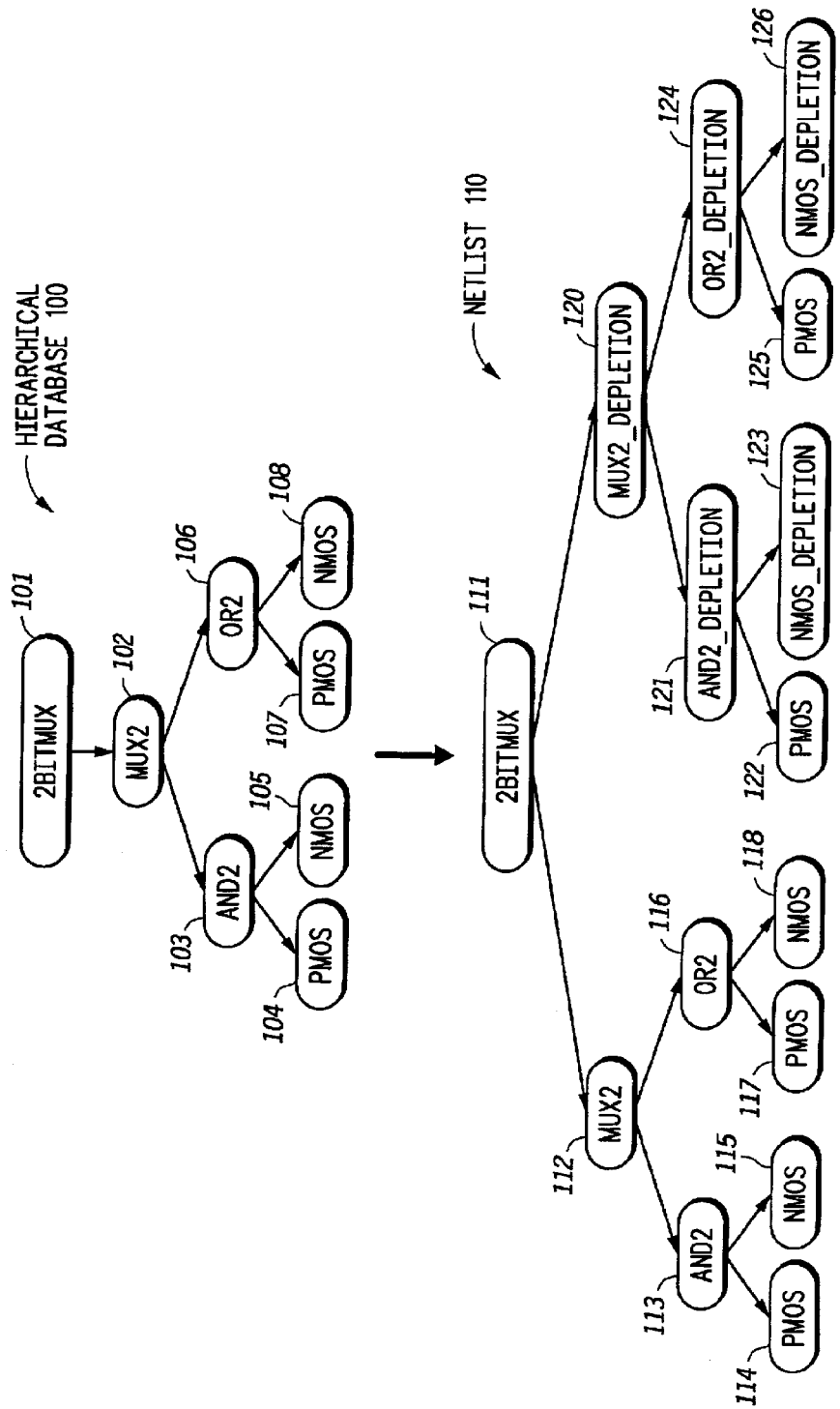
FIG. 8 illustrates, in block diagram form, a hierarchical database and netlist for a sample circuit named "2BITMUX" in accordance with one embodiment of the present invention.

No mechanism currently exists for a netlister to transform an attribute into an entirely different cell like this at netlisting time, thus forcing the designer to create separate and2_depletion 121 and or2_depletion 124 cells, as illustrated in FIG. 8. These cells 121 and 124 use the desired nmos_depletion cells 123 and 126. In turn, a new MUX2_depletion 120 cell has to be created which instantiates the and2_depletion 121 and or2_depletion 124 cells. Now, as seen in the bottom half of FIG. 8, the database is severely complicated by this seemingly simple change. When the netlister traverses this hierarchy, the resulting list also grows significantly:

("pmos", "nmos", "nmos_depletion", "and2_depletion", "and2", "or2_depletion", "or2", "MUX2_depletion", "MUX2", "2BITMUX")

A solution that allowed one to parameterize the hierarchy itself, such as by adding an inheritable "mode" attribute to nmos instances, would eliminate a great deal of complexity. The present invention allows the designer to do just that, placing the weight of the problem instead on the netlister to perform the hierarchy transformation at netlisting time.

In general, hierarchical netlisters have the following three core functions: a hierarchy traversal which determines all the child cells to netlist; a way to netlist those cells; and a way to netlist instances of those cells, as they appear in parent cells. With CTI (cell transformation indicating) attributes, a fourth core function is added, which enables the netlister to hierarchically restructure portions of the database. Thus the present invention adds a fourth core function to netlisters, namely a virtual cell mapping function 130 (See FIG. 9), which receives a real cell 131 from the database and a list of cell transformations indicating CTI attributes 132, and maps the inputs to another cell, which may be either real (133, 139) or virtual (134, 135). As used throughout this document, a virtual cell is defined to be a cell which does not actually exist in the database, yet needs to be generated programmatically at run-time.

Figure 10:
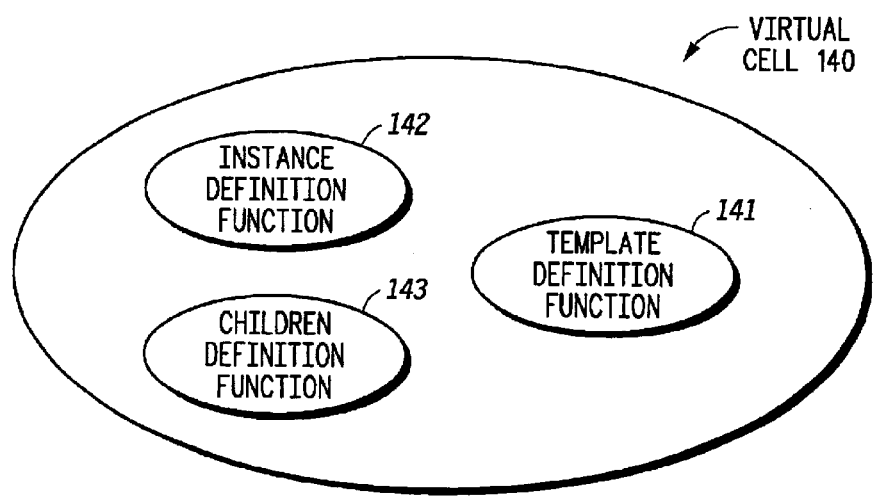
FIG. 10 illustrates, in block diagram form, one embodiment of a virtual cell 140 in accordance with the present invention.

Referring to FIG. 10, in one embodiment of the present invention, a virtual cell is used to provide information to netlist an instance, to netlist a template, and to provide a list of its children. This embodiment's virtual cell definition function 140 is used with a database representing a complex circuit, such as that illustrated in FIG. 8. Note in FIG. 8 that MUX2_depletion 120, and2_depletion 121, and or2_depletion 124 are good examples of virtual cells. They behave like real cells and appear as cells in the hierarchy tree, but as illustrated in FIG. 8, they exist only in the netlist 110 and not in the hierarchical database 100.

Figure 9:
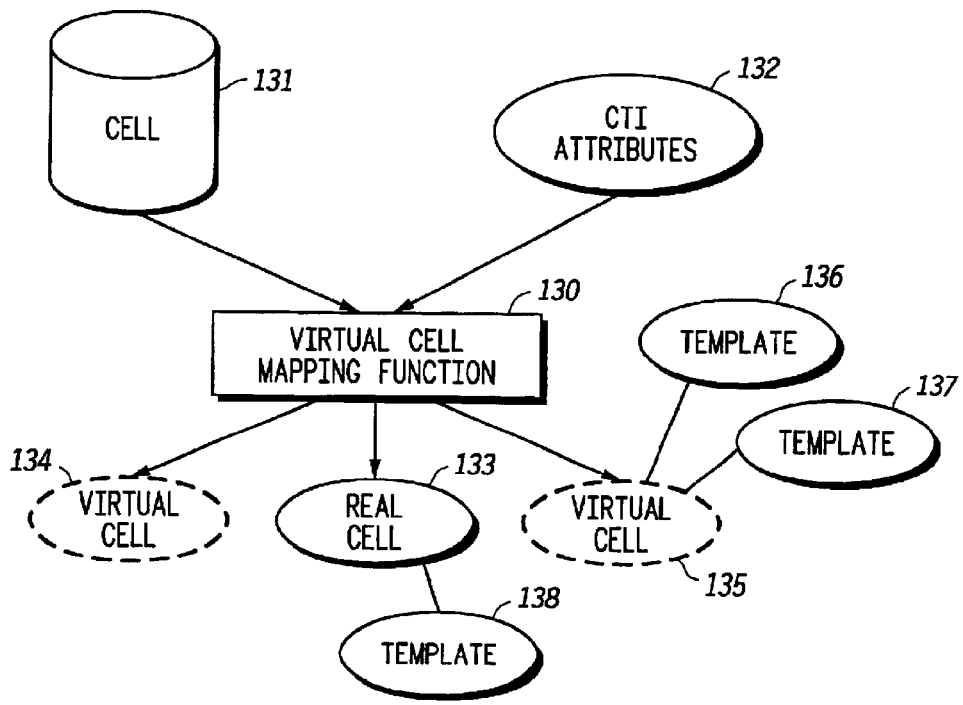
FIG. 9 illustrates, in block diagram form, a virtual cell mapping function in accordance with one embodiment of the present invention.

To resolve this discrepancy between the database 100 and the netlist 110, a virtual cell mapping function 130, illustrated in FIG. 9, retrieves a real cell 131 from the database, together with CTI attributes 132, to create a plurality of different cells such as real cell 133, virtual cell 134, and virtual cell 135. Note that the cells created 133–135 may be different from each other. Note that in some embodiments of the present invention, different CTI attributes 132 may result in the same virtual cell 134. However, when that virtual cell 134 is instantiated, those different CTI attributes may produce different circuits. In some cases, the circuits may be very similar, and in other cases the circuits may be very different. Note that real cells such as real cell 133 and 139 are cells that are stored in the database, unlike virtual cells which are represented merely as a section of software code. Note that the section of software code used to represent a virtual cell may or may not also refer to the database. Note also that the schematic created from a real cell, such as real cell 133, is always the same. This means that the circuit representation of a real cell (e.g. real cell 133) is always the same as the one representation in the database itself. Note that, in an alternative embodiment, cell 131 may itself be a virtual cell, which may be mapped to another virtual cell or a real cell based on the CTI attributes.

In one embodiment of the present invention, once the virtual cell has been determined by virtual cell mapping function 130, the virtual cell itself may be defined as three functions (see FIG. 10), namely a template definition function 141, an instance definition function 142, and a children definition function 143. These three functions, when put together, serve to make the virtual cell 140 behave like a real cell, from a netlisting standpoint. Alternate embodiments of the virtual cell 140 may include additional definition functions than those illustrated in FIG. 10. In addition, alternative embodiments of the present invention may use different, fewer, or additional definition functions than those illustrated in FIG. 10. The virtual cell definition function 140 illustrated in FIG. 10 is the one that is used throughout the flow chart represented in FIGS. 1–5 which uses a database representation of a complex circuit.

FIG. 9 illustrates one embodiment of an interface for a virtual cell mapping function 130. A cell 131 and a set of CTI attributes 132 are passed in as inputs. The virtual cell mapping function 130 transforms the inputs into another cell, and returns the new cell as an output. By varying the CTI attributes 132, a myriad of different cells, such as real cells 133 and 139, or virtual cells 134 and 135, can potentially be output by function 130 for the same input cell 131.

Here is an sample virtual cell definition function 130 in pseudocode:

```
Function VirtualCell (cell, hierarchical s)
    struct Virtual_cell       # Define a Virtual cell
        name                  # Make its data structure look like a regular cell.
        regular attributes
        CTI attributes
        connectivity
        instances
    end struct
    if (a recognized cell/CTI attribute combination) then
        define the new cell's name
        define the new cell's s, inheriting s from the function's inputs where necessary
        define the new cell's connectivity   # most likely this will remain
```

-continued

```
unchanged
    define each child instance
        define each child instance's attributes, inheriting attributes from the
function's inputs where necessary
        return Virtual_cell
    else return cell    # if no transformation is needed, just return the original
cell
end Function
```

Applying this function to the 2BITMUX example:

```
Function VirtualCell (cell, CTI attributes)
    local variable Virtual_cell
    Virtual_cell = cell    # use the original cell as the starting point
    if(cell == "and2" && mode_and == "depletion") then
        Virtual_cell->name = "and2_depletion"
        foreach nmos instance
            # nmos_depletion cells actually exist in the database.
            replace with an nmos_depletion instance
        end if
    if(cell == "or2" && mode_or == "depletion") then
        Virtual_cell->name = "or2_depletion"
        foreach nmos instance
            # nmos_depletion cells actually exist in the database.
            replace with an nmos_depletion instance
        end if
    if (cell == "MUX2" && mode_mux == "depletion") then
        Virtual_cell->name = "MUX2_depletion"
        foreach and2 instance   # Virtual Cells can have instances of Virtual
Cells, too!
            and2->mode_and = "depletion"
            foreach or2 instance
                or2->mode_or = "depletion"
        end if
    return Virtual_cell
end Function
```

Thus the virtual cell mapping function described above returns a complete schematic which the other three core functions can use.

FIG. 8 illustrates the manner in which a 2BITMUX may be stored in hierarchical database 100 and as a netlist 110. Note that 2BITMUX 101 has corresponding attributes in its schematic, some of which specify whether the 2BITMUX's children use depletion or enhancement mode transistors. FIG. 8 illustrates the transformation that occurs when a netlist 110 is generated from a hierarchical database 100.

Referring to the hierarchical database 100, 2BITMUX 101 contains within it two instances of MUX2 102 which have different attributes. Referring now to netlist 110, these 2BITMUX 111 are thus instantiated as MUX2 112 and MUX2_depletion 120. This was enabled by the fact that the two instances of MUX2 102 have different CTI attributes, one of which maps to MUX2_depletion 120, which is a virtual cell. This allowed two completely separate cells (MUX2 102 and MUX2_depletion 120), one virtual and one real, to be generated in netlist 110 from one common cell (MUX2 102) in the hierarchical database 100. The prior art did not allow such separate circuits as MUX2 112 and MUX2_depletion 120 to be created from a common cell MUX2 102. Nor did the prior art allow such circuits as 2BITMUX 101 to modify the nature and number of its children in the manner demonstrated between 2BITMUX 101 and 2BITMUX 111. Note that MUX2_depletion 120, in turn, has two children: AND2_depletion 121 and OR2_depletion 124. AND2_depletion 121 has two children PMOS 122 and NMOS_depletion 123. OR2_depletion 124 has two children, namely PMOS 125 and NMOS_depletion 126. Similarly, MUX2 112 has two children AND2 113 and OR2 116. AND2 113 has two children, namely PMOS 114 and NMOS 115. OR2 116 has two children, namely PMOS 117 and NMOS 118. Note that MUX2_depletion 120 has different children than MUX2 112. Note that AND2_depletion 121 and AND2 113 have some children in common (e.g. PMOS 114, 122) and some children which are different (e.g. NMOS 115 and NMOS_depletion 123). Note the significant power that can be gained by using a virtual cell. Different instantiations of a virtual cell can have different children or different grandchildren or different great-grandchildren from each other, as indicated by different CTI attributes. This can theoretically be continued to infinity. Thus the reference to a virtual cell for MUX2_depletion 120 by 2BITMUX 111 prevents the necessity of using separate real cells for MUX2 112 and MUX2_depletion 120.

In the above example there were only two separate cells which needed to be instantiated in a different way (112, 120) however many other applications require a prohibitively large number of different cells to be developed and stored in the data base. Note that by implementing MUX2_depletion 120, AND2_depletion 121, and OR2_depletion 124 as virtual cells, with corresponding attributes on their respective parent cells, it was possible to create netlist 110 of a much more complex circuit than was directly represented by the hierarchical database 100. In addition, virtual cell MUX2_depletion 120 can be used to create a wide variety of netlisted circuits different than netlist 110. For example, the cell 2BITMUX 101 includes 36 transistors, each of which could theoretically be either enhancement mode or depletion mode. Thus, there are $2^{36}$ possible netlists that can be created from one cell 2BITMUX 101, if the virtual cell MUX2_depletion 120 is programmed to encompass all possible combinations. The prior art would have required a different cell similar to 2BITMUX 101 to be created for all $2^{36}$ circuits that were used in the database representation of the complex circuit.

Note that FIG. 8 illustrates the manner in which the hierarchical database 100 may be flattened to produce netlist 110. Note that although FIG. 8 does not illustrate reverse flattening, it would be possible to reverse flatten the circuit illustrated by netlist 110 in order to produce the circuit illustrated by hierarchical database 100. Note that one way in which reverse flattening may occur is by parameterizing a characteristic of a circuit such as MUX2 112 and MUX2_depletion 120. In this example, depletion or enhancement may be parameterized or made as an attribute of MUX2 102. In a similar manner, reverse flattening may occur for any type of hierarchical database, not just a hierarchical database 100 representing a circuit.

Thus the present invention is useful for flattening and reverse flattening any hierarchical database, not just hierarchical databases used to represent circuits. The present invention adds some potentially valuable data-management capabilities, including representing lower-level circuits with identical logic behavior but different timing behavior as a single cell in the database. In this case, logic-only applications may want to see a hierarchy different and simpler than what physical-based applications desire. Another capability is representing slight variances in connectivity as attributes on the instance, rather than as an entirely new cell in the database. Yet another capability is mixed switch-level and gate-level netlisting, which for example, may be used for improved fault coverage.

Figure 1:
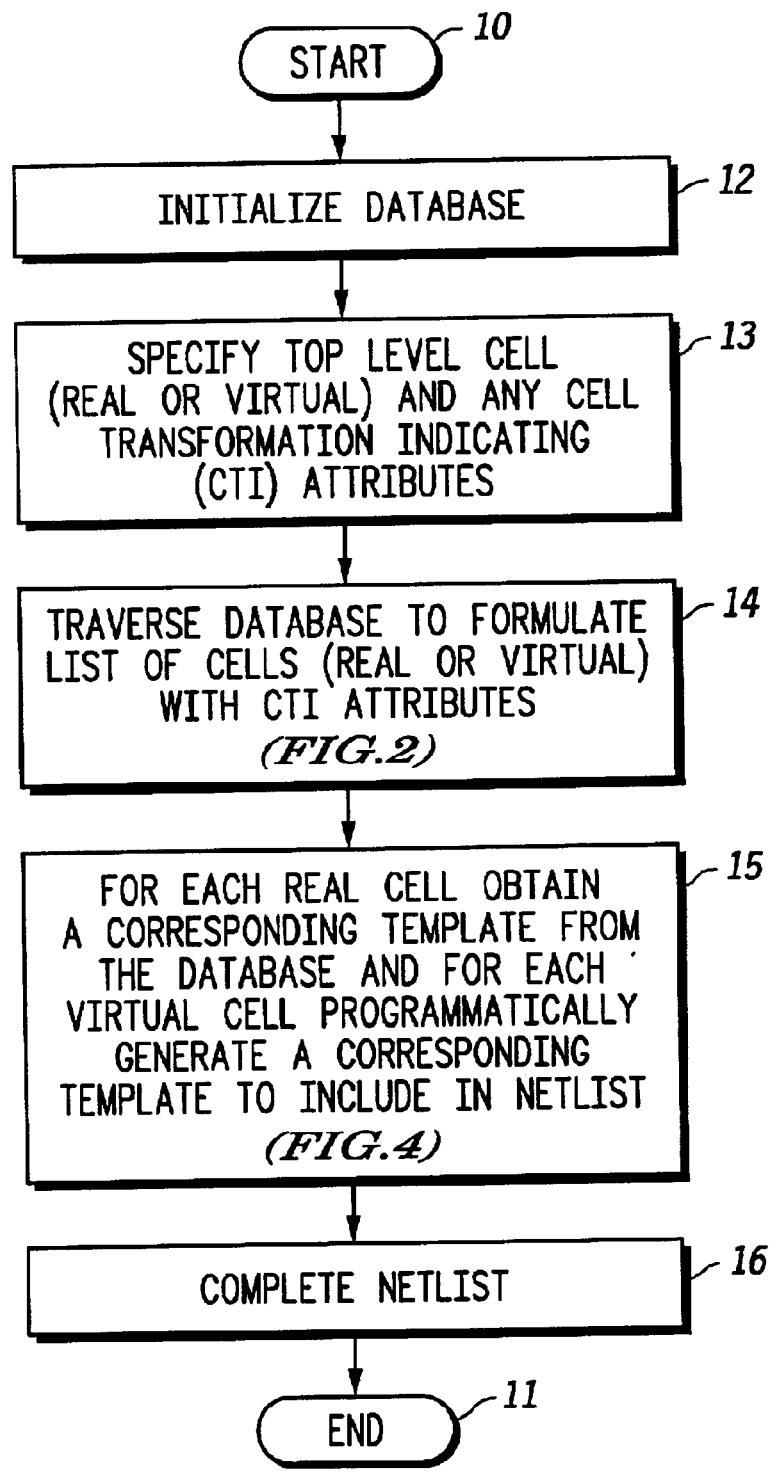
FIG. 1 illustrates, in flow diagram form, one embodiment of a method in accordance with the present invention.

FIGS. 1–5 illustrate a flow chart describing one embodiment of the present invention. In FIGS. 1–5, ovals illustrate starting and stopping points, diamonds illustrate decision points, and rectangles indicate steps in the flow. Referring now to FIG. 1, the flow starts at oval 10 and moves to step 12 where the database is initialized. Next, in step 13 the top-level cell either real or virtual is specified along with any cell transformation indicating CTI attributes. The flow then moves to step 14 where the database is traversed to formulate a list of cells (either real or virtual) with CTI attributes. Note that step 14 is described in more detail in the flow illustrated in FIG. 2. The flow then moves to step 15 where for each real cell a corresponding template is obtained from the database and for each virtual cell a corresponding template is programmatically generated and then included in a netlist. Note that step 15 is further described in FIG. 4. The flow in FIG. 1 next moves to step 16 where the netlist is completed. Step 16 may include such functions as adding headers and footers and comments to the netlist. Step 16 may also include other optional operations or functions. The flow illustrated in FIG. 1 then moves to end oval 11. Note that each cell can have different children based on the CTI attributes. Step 14 illustrates a hierarchical recursive traversal of a tree to produce a flat list of cells and their corresponding CTI attributes.

Figure 2:
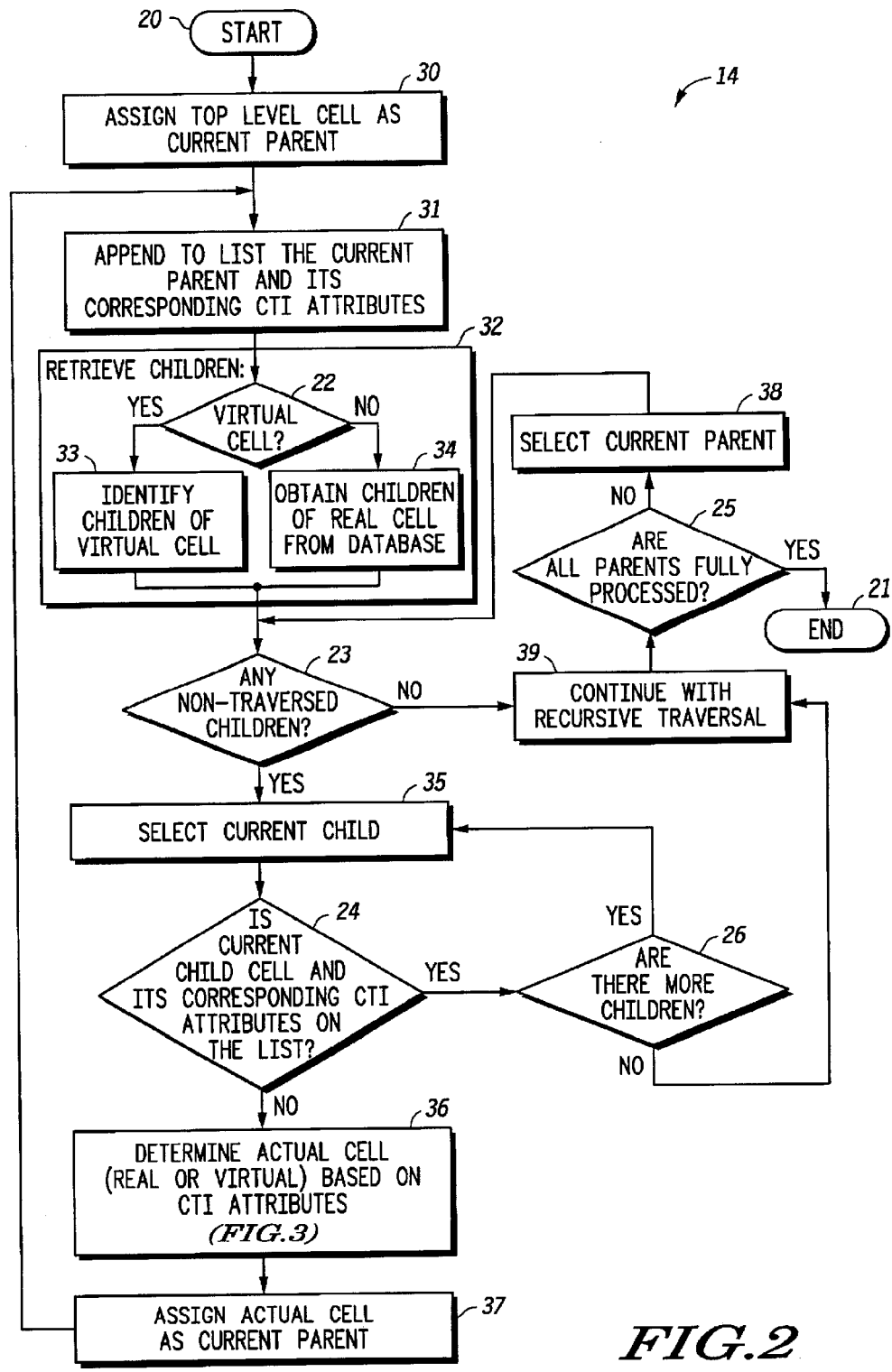
FIG. 2 illustrates, in flow diagram form, one embodiment of step 14 of FIG. 1 in accordance with the present invention.

Moving now to FIG. 2, FIG. 2 illustrates the step of box 14 (See FIG. 1) in more detail. FIG. 2 starts at start oval 20 where the flow then moves to step 30 where a top-level cell is assigned as the current parent. Next the flow moves to step 31 where the current parent and its corresponding CTI attributes are appended to the list. Note that in the prior art only the current parent would have been appended to the list, not its corresponding CTI attributes. Next, the flow moves to step 32 where the children are retrieved. Step 32 includes decision diamond 22 which tests to see whether the current parent is a virtual cell. If the current parent is not a virtual cell, the flow continues at step 34 where the children of the real cell are obtained from the database. If the current parent is a virtual cell, then the flow continues to step 33 where the children of the virtual cell are identified.

After steps 32–34 the flow continues at decision diamond 23 where a check occurs to see if there are any remaining non-traversed children. If there are no remaining non-traversed children, then the flow continues with step 39 where the recursive traversal of the hierarchical database continues. Note that for each child, grandchild, great-grandchild, etc. within the hierarchical database, the flow illustrated in FIG. 2 is repeated. Step 39 describes the recursive traversal through the hierarchical database which occurs when the parent's parent is checked to see if all of its children have been traversed. If that is true, then the flow pops up one more level to the parent's parent to check and see if all of its children have been traversed. The flow then continues with decision diamond 25 which checks to see if all the parents have been fully processed. If all of the parents have been fully processed, the flow continues at end oval 21. If all of the parents have not been processed, the flow continues at step 38 where a new current parent is selected and the flow then continues at decision diamond 23 once again.

If decision diamond 23 determines that there are indeed non-traversed children remaining, then the flow continues at step 35 where a current child is selected. The flow then continues to decision diamond 23 where the determination is made as to whether the current child's cell and its corresponding CTI attributes are already on the list. If the current child's cells and its corresponding CTI attributes are on the list, then the flow continues at decision diamond 26 where the determination is made as to whether there are more children. If there are not more children, then the flow moves to step 39 where the recursive traversal is continued. If there are more children, then the flow continues at step 35 where a new current child is selected. The flow then continues to decision diamond 24 where a determination is made as to whether the new current child and its corresponding CTI attributes are already existing on the list. If they are not on the list, then the flow continues at step 36 where the actual cell (real or virtual) based on the CTI attributes is determined.

Figure 3:
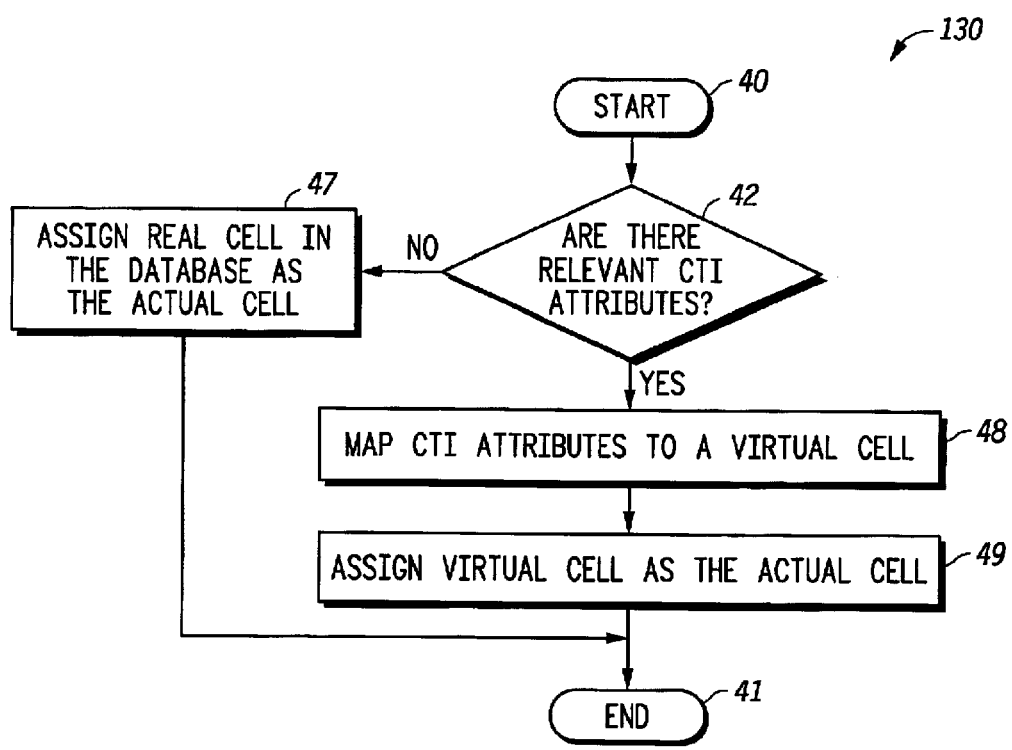
FIG. 3 illustrates, in flow diagram form, one embodiment of a virtual cell mapping function 130 in accordance with the present invention.

Note that the flow illustrated in FIG. 3 is performed in order to determine the children and to store the information on the cells and attributes for the children. FIG. 3 illustrates one possible flow for implementing step 36. Alternate flows for implementing the various steps in FIGS. 1–5 may be used. Referring to FIG. 2, from step 36 the flow continues to step 37 where the actual cell is assigned as the current parent. From step 37 the flow continues back up to step 31. Note that the stopping condition for the flow in FIG. 2 is when all children and all parents have been fully processed. If that is the case, the flow then ends at oval 21. Note that the flow illustrated in FIG. 2 is a recursive traversal and thus is very difficult to represent in flow chart form.

Referring to FIG. 3, the flow starts at oval 40 and proceeds to decision diamond 42 which determines whether there are relevant CTI attributes. If there are no relevant CTI attributes, then the flow continues at step 47 where a real cell in the database is assigned as the actual cell. If there are relevant CTI attributes, then the flow continues at step 48 where the CTI attributes are mapped to a cell, either real or virtual. Please note that the cell may or may not be the same cell that would have been assigned had there not been CTI attributes, as assigned in step 47. Next the flow continues at step 49 where the cell assigned in step 48 is assigned as the actual cell. After step 47 and 49 the flow ends at oval 41. Note that an actual cell is the cell that is created by the virtual cell mapping function 130 (See FIG. 9).

As illustrated in FIG. 9, the actual cell created by virtual cell mapping function 130 may be one of real cell 133, real cell 139, virtual cell 134, or virtual cell 135. It is important to note that an actual cell may be either a virtual cell or a real cell. Note that FIG. 3 illustrates one embodiment of virtual cell mapping function 130 illustrated in FIG. 9. Note that in one embodiment of the present invention, the real cell in step 47 may, in fact, be stored in the database as a section of software code, making it behave much like a virtual cell. Thus, as a result, both step 49 and step 47 return the same data type in that in one embodiment the data type for both is the function. In another embodiment, the function for the virtual cell in step 48 queries the database to retrieve the real cell information, making it behave much like a real cell. Note that for step 48 a case statement, an if-then-else statement, or a hash table may be used to do the mapping. Alternate embodiments of the present invention may use any variety of programming techniques to perform this mapping function.

Note that the relevant CTI attributes described in decision diamond 42 may vary based upon the tool which will be utilizing the resulting netlist. As an example, a netlist created for a logic simulator tool would not consider any or some timing related attributes relevant. Note also that one attribute can render another attribute irrelevant. For example, an and-gate can be static or dynamic, and if dynamic then pre-clear or pre-charge, which is rendered irrelevant if static is chosen.

Note that one advantage of the present invention is that a virtual cell 135 can create a plurality of templates 136, 137 which may be different due to one or more of the CTI attributes 132. For example, if virtual cell 135 includes a CTI attribute 132 for enhancement or depletion mode transistors, template 136 may include depletion mode transistors and template 137 may include enhancement mode transistors. Note that real cells, such as real cell 133, may only produce a single template, such as template 138. Thus the current invention allows more flexibility in creating the templates which are used to form a netlist.

Figure 4:
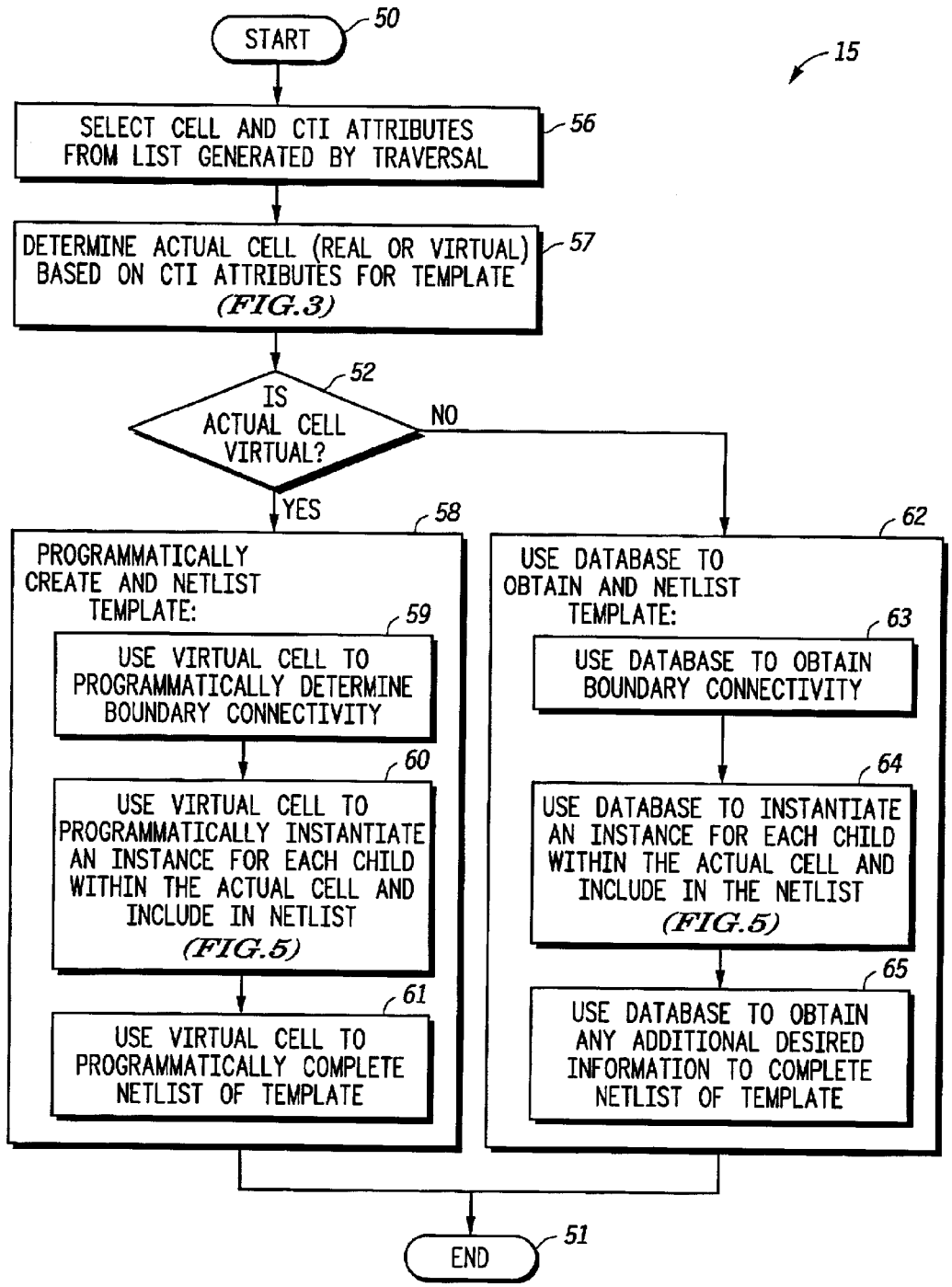
FIG. 4 illustrates, in flow diagram form, one embodiment of step 15 of FIG. 1 in accordance with the present invention.

FIG. 4 illustrates one embodiment of step 15 illustrated in FIG. 1. The flow of FIG. 4 starts at oval 50 and proceeds to step 56 where a cell and its corresponding CTI attributes are selected from a list generated by the traversal illustrated in FIG. 2. The flow then proceeds to step 57 where the actual cell (real or virtual) is determined based on the CTI attributes for the template. FIG. 3 illustrates one embodiment of a flow used to implement step 57. Following step 57 the flow of FIG. 4 proceeds to decision diamond 52 where a determination is made as to whether the actual cell is virtual. If the actual cell is virtual, the flow proceeds to step 58. If the actual cell is not virtual, then the flow proceeds to step 62. Step 58 programmatically creates and netlists a template. Step 58 includes steps 59, 60 and 61 which may occur in any logical order within step 58. Note that portions of steps 59, 60 and 61 may take place concurrently. Step 58 includes step 59 where a virtual cell is used to programmatically determine the boundary connectivity of the template. In step 60 a virtual cell is used to programmatically instantiate an instance for each child within the actual cell and the result is included in the netlist.

Figure 5:
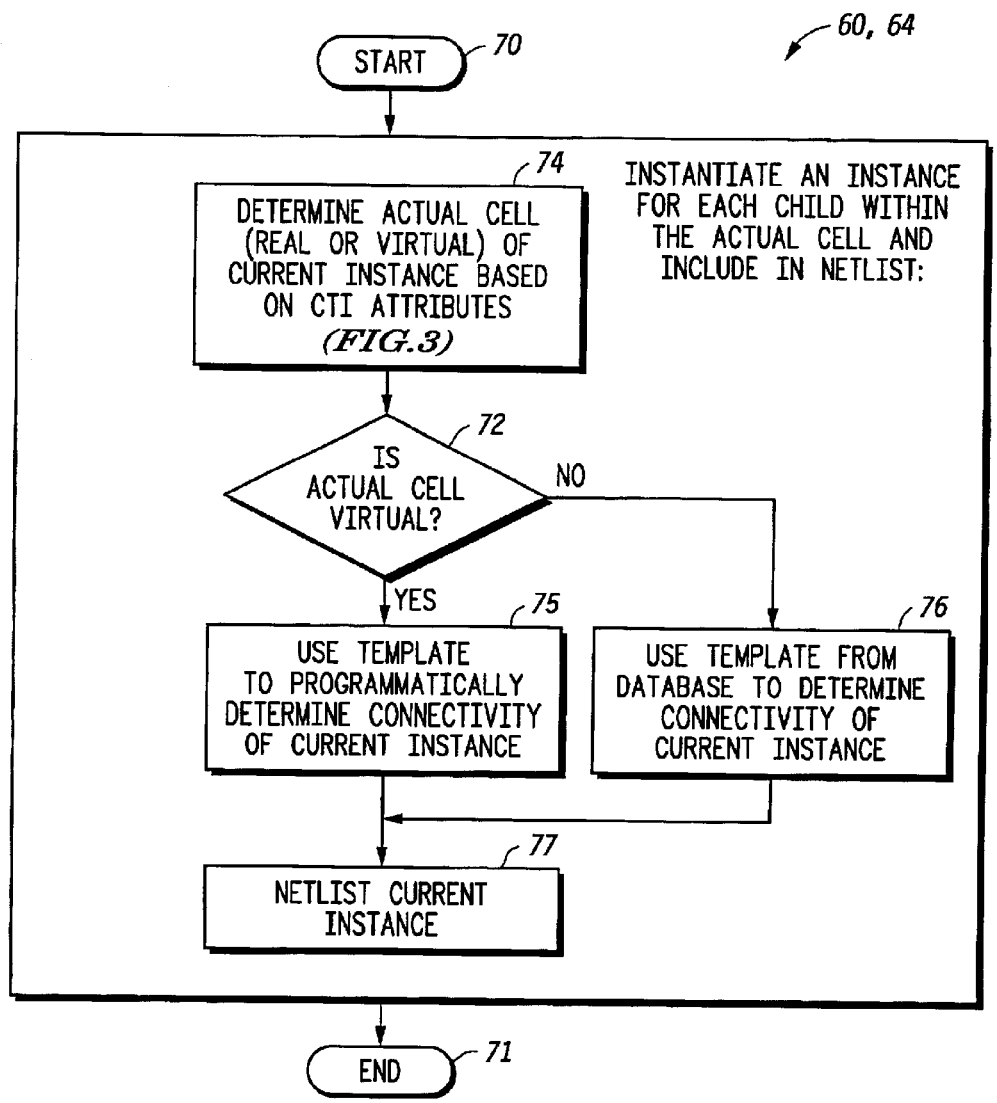
FIG. 5 illustrates, in flow diagram form, one embodiment of step 60 or step 64 of FIG. 4 in accordance with the present invention.

Note that FIG. 5 illustrates one embodiment of a flow which may be used to implement step 60. In step 60 a virtual cell is used to programmatically complete the netlist of the template. Referring now to step 62, step 62 uses a database to obtain and netlist a template. Step 62 includes step 63–65 which may occur in any order or may take place concurrently within step 62. Step 63 uses a database to obtain the boundary connectivity of the template. Step 64 uses a database to instantiate an instance for each child within the actual cell and then includes this in the netlist.

FIG. 5 illustrates one embodiment of a flow which may be used to implement step 64. Step 65 uses the database to obtain any additional desired information to complete the netlist of the template. Both steps 58 and 62 then proceed to end oval 51. Note that in an alternate embodiment of the present invention, step 57 may be omitted from FIG. 4 if sufficient information is stored during step 36 (See FIG. 2). FIG. 4 illustrates a flow in which a flat list is traversed in order to create a netlist.

FIG. 5 illustrates one embodiment of step 60 and step 64 of FIG. 4. The flow of FIG. 5 starts at oval 70 and proceeds to step 73. Step 73 instantiates an instance for each child within the actual cell and includes that instantiation in the netlist. In step 74 an actual cell (real or virtual) of the current instance is determined based on CTI attributes. Note that FIG. 3 illustrates one possible flow which may be used to implement step 74. The flow of FIG. 5 proceeds from step 74 to decision diamond 72 which determines whether the actual cell is virtual or not. If the cell is virtual, the flow continues at step 75 where a template is used to programmatically determine the connectivity of the current instance. If the actual cell is not virtual but is real, then the flow continues at step 76 where a template from the database is used to determine the connectivity of the current instance. From step 75 and step 76 the flow continues at step 77 where the current instance is netlisted. After step 73 the flow proceeds to end oval 71. Note that the steps within step 73 may be carried out in different ways and in different orders.

For example, smaller or larger portions of connectivity may be determined before that connectivity is provided to the netlist. Note that for the topmost level a template may not be required for connectivity or for any other reason. Note also that step 74 allows each child to be netlisted.

Figure 6:
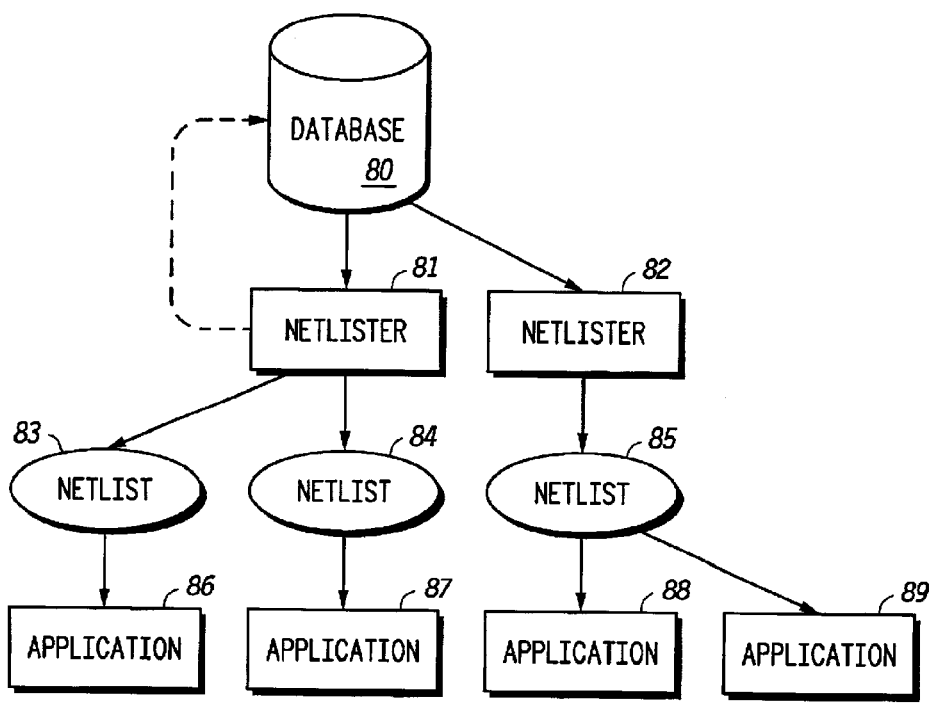
FIG. 6 illustrates, in block diagram form, a manner in which the software portions of FIG. 1 correspond to each other in accordance with one embodiment of the present invention.

FIG. 6 illustrates the way that a netlister 81 or 82 may be used to create one or more netlists 83, 84, 85, which in turn may be used by one or more applications 86–89. Netlisters 81, 82 retrieve information from database 80 in order to create netlists 83–85. Different applications 86–89 operating on the same unified database 80 may wish to parse these CTI attributes differently, resulting in different hierarchies for different applications. This capability may be very useful. For the purposes of this invention, netlisters are used as the interface between the database 80 and applications 86–89, which must translate the database into the applications' desired input formats. One embodiment of the present invention involves flat netlisters, which have no hierarchy in their outputs.

Figure 7:
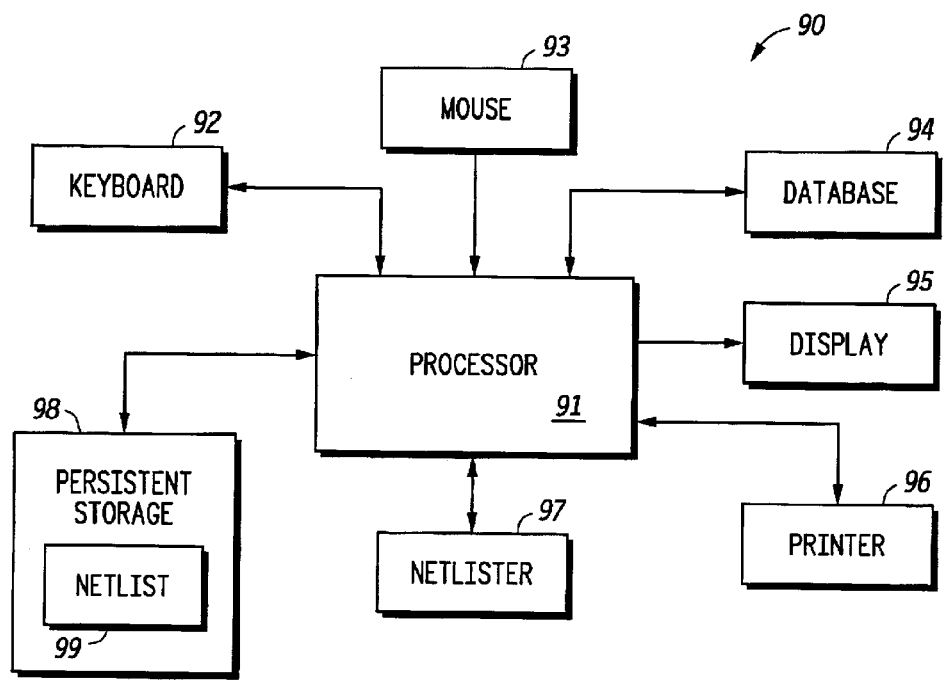
FIG. 7 illustrates, in block diagram form, one embodiment of a system for executing the software of FIG. 1 in accordance with the present invention.

Referring now to FIG. 7, FIG. 7 illustrates one embodiment of a computer apparatus 90. Netlist 99 may be stored on persistent storage 98. Persistent storage 98, keyboard 92, database 94, display 95, printer 96 and netlister 97 are all bi-directionally coupled to processor 91. Mouse 93 is coupled to processor 91 to provide inputs. Alternate embodiments of computer apparatus 90 may include fewer, more or different blocks than those illustrated in FIG. 7. In alternate embodiments database 94, netlister 97 and netlist 99 may all be stored on separate or the same memory storage device. In one embodiment this storage device may be persistent storage.

For the present invention, note that the hierarchy traversal must be modified to account for virtual cells and CTI attributes. Whereas previously the traversal keyed off of only unique cell types to determine which cells to descend into, the traversal must now key off of both cell types and CTI attributes to determine where to descend. Where virtual cells are reached, the virtual cell's children definition function 140, illustrated in FIG. 10, determines these children. This is because multiple instances of the same cell, whether real or virtual, can potentially result in different hierarchy trees for netlisting purposes.

```
From:
Recursive Function BuildList(topcell)
    Add topcell to list.
    foreach unique cell type under topcell
        if cell is not already in the list then
            BuildList(cell)
        endif
    end foreach
endFunction
To:
Recursive Function BuildList(topcell, CTI attributes)
    Add '(topcell, CTI attributes) to list.
    # remap parent cell to a Virtual Cell, if appropriate. Default is to leave topcell alone.
    actual_topcell = VirtualCell.childrenDefinitionFunction(topcell, CTI attributes)
    foreach unique combination of '(cell type, CTI attributes)
      under actual_topcell
        if '(child's cell type, child's CTI attributes) is not already
          in the list then
            BuildList(child's cell type, child's CTI attributes)
        endif
    end foreach
endFunction
```

Note two fundamental changes in the illustrated embodiment of the present invention:
1) VirtualCell.childrenDefinitionFunction is given the power to override the default traversal. In other words, if the Virtual Cell mapping function 130 recognizes a given cell type/CTI attribute combination to map to a Virtual Cell, the Virtual Cell's children could be different from the real cell's. The hierarchy traversal has to account for that.
2) The data structure for the list has changed. Instead of just a list of unique cell types, the atomic elements under the list now consist of unique cell type/CTI attribute pairs.

In other words, (cell1 cell2 cell3 cell4).
is now: ((cell1 hierParms1) (cell1 hierParms2) (cell2 hierParms1 . . . )).
In the 2BITMUX example of FIG. 8, the list changes from: ("pmos" "nmos" "and2" "or2" "MUX2" "2BITMUX")
To: ((pmos, null) (nmos, null) (nmos_depletion, null) (and2, mode_and=depletion) (and2, mode_and=enhancement) (or2, mode_or=depletion) (or2, mode_or=enhancement) (MUX2, mode_mux=depletion) (MUX2, mode_mux=enhancement) (2BITMUX, null))

Note how each element in the new list maps to a different Virtual Cell. Here is a sample traversal of the example in FIG. 8, in detail, using the present invention:
→BuildList (2BITMUX, null)
    List=null
Begin by calling the top-level cell 2BITMUX (FIG. 8 101, FIG. 11 150), with no differentiating CTI attributes. In another embodiment, it is possible to netlist a variation even of the top-level cell, but not here. BuildList( ), performing a prefix hierarchy traversal, first adds (2BITMUX, null) to the list, then recursively descends into the first MUX2 instance (FIG. 8. 102, FIG. 11 151).
→BuildList (MUX2, mode_mux=depletion)
    List=((2BITMUX, null))
First, (MUX2, mode_mux=depletion) is added to the list. Next, VirtualCell.childrenDefinitionFunction (MUX2, mode_mux=depletion) is invoked in order to determine the children. This returns two virtual cells as children: and2_depletion 121, and or2_depletion 124. BuildList( ) then descends into and2_depletion 121.
→BuildList (and2, mode_and=depletion)
    List=((MUX2, mode_mux=depletion) (2BITMUX, null))
(and2, mode_and=depletion) is added to the list, and then VirtualCell.childrenDefinitionFunction (and2, mode_and=depletion) is invoked. The software recognizes the combination and returns 3 instances of pmos (FIG. 8 104, FIG. 11 171–173) and 3 instances of nmos_depletion (FIG. 8 123). Nmos_depletion 123 is a real cell, yet different from nmos 105, the real cell which the hierarchy traversal prior to this invention would have returned. The software then descends into nmos_depletion 123.
→BuildList (nmos_depletion, null)
    List=((and2, mode_and=depletion) (MUX2, mode_mux=depletion) (2BITMUX, null))
(Nmos_depletion, null) is added to the list. Nmos_depletion 123 is a real cell, and with no children. With no further recursion occurring here, BuildList( ) returns control back up to (and2, mode_and=depletion).
→BuildList (and2, mode_and=depletion)
    List=((nmos_depletion, null) (and2, mode_and=depletion) (MUX2, mode_mux=depletion) (2BITMUX, null))
Since pmos 104 is a real cell, no remapping is done. BuildList (pmos, null) is invoked. Pmos 104, also a leaf cell, results simply in (pmos, null) being added to the list and control returns back to (and2, mode_and=depletion). With every instance in the virtual cell and2_depletion 121 now accounted for, control returns to (MUX2, mode_mux=depletion).
→BuildList (MUX2, mode mux=depletion)
    List=((pmos, null) (nmos_depletion, null) (and2, mode_and=depletion) (MUX2, mode_mux=depletion) (2BITMUX, null))
The second instance of and2 in this virtual cell MUX2_depletion 120 also has mode_and=depletion, so this is not a unique cell-type/CTI attributes combination. As a result, the software does nothing additional. The or2 instance, with a different cell type, is different, so it must be checked.
→BuildList (or2, mode_or=depletion)
    List=((pmos, null) (nmos, mode=depletion) (and2, mode_and=depletion) (MUX2, mode_MUX2=depletion) (2BITMUX, null))
(Or2, mode_or=depletion), when passed to the virtual cell mapping function 130, recognizes this to be virtual cell or2_depletion 124. Again the pmos instances are left alone and the nmos instances are swapped out with nmos_depletion instances by the virtual cell mapping function 130. But this time, because of the prior visit to and2_depletion 121, both of those cells are already in the list. No further action is required. (Or2, mode_or=depletion) is added to the list and the software returns to (MUX2, mode_mux=depletion).
→BuildList (MUX2, mode_mux=depletion)
    List=((pmos, null) (nmos_depletion, null) (and2, mode_and=depletion) (or2, mode or=depletion) (MUX2, mode_mux=depletion) (2BITMUX, null))
Every cell under MUX2 depletion 120 is accounted for. The software returns again to (2BITMUX, null)
→BuildList (2BITMUX, null)
    List=((pmos, null) (nmos_depletion, null) (and2, mode_and=depletion) (or2, mode_or=depletion) (MUX2, mode_mux=depletion) (2BITMUX, null))
The second MUX2 152 in 2BITMUX (FIG. 11 150, FIG. 8 101) is the same cell type as the first, but has a different CTI attribute, "mode_mux=enhancement". The change in the CTI attribute spurs a revisit of MUX2 102. This differs fundamentally from a traditional netlister, which would not visit the same cell twice.
→BuildList (MUX2, mode_mux=enhancement)
    List=((pmos, null) (nmos_depletion, null) (and2, mode_and=depletion) (or2, mode_or=depletion) (MUX2, mode_MUX2=depletion) (MUX2, mode_mux=enhancement) (2BITMUX, null))
By design, the virtual cell mapping function 130 does not recognize "mode_mux=enhancement". If necessary, it can go ahead and assign "mode_and=enhancement" and "mode_or=enhancement" values to the mux's children, but the desired behavior is for any "mode=enhancement" value to result in default behavior. VirtualCell.childrenDefinitionFunction (MUX2, mode_mux=enhancement) returns the real cell MUX2 112 for BuildList( ) to descend into, which in turn has real cells and2 113 and or2 116.
→BuildList (and2, mode_and=enhancement)
    List=((pmos, null) (nmos_depletion, null) (and2, mode_and=depletion) (and2, mode_and=enhancement) (or2, mode_or=depletion) (MUX2, mode_MUX2=depletion) (MUX2, mode_mux=enhancement) (2BITMUX, null))
The virtual cell mapping function 130 returns the real cell and2 113, which contains the real cells pmos 114 and nmos 115. Although pmos 114 is already in the list, nmos 115 is not. Nmos 115 is also a leaf cell, so BuildList( ) needs only to add (nmos, null) to the list and return control to (MUX2, mode=enhancement).

→BuildList (MUX2, mode_mux=enhancement)
List=((pmos, null) (nmos, null) (nmos_depletion, null) (and2, mode_and=depletion) (and2, mode_and= enhancement) (or2, mode_or=depletion) (MUX2, mode_MUX2=depletion) (MUX2, mode_mux= enhancement) (2BITMUX, null))

The other and2 instance, also with mode_and= enhancement, is already accounted for. BuildList( ) then similarly descends into "(or2, mode_or=enhancement)", which in turn finds "(nmos, null)" and "(pmos, null)" already in the list. This MUX2 112 is done. The software return again to 2BITMUX.

→BuildList (2BITMUX, null)
List=((pmos, null) (nmos, null) (nmos_depletion, null) (and2, mode_and=depletion) (and2, mode_and= enhancement) (or2, mode_or=depletion) (or2, mode_ or=enhancement) (MUX2, mode_mux=depletion) (MUX2, mode_mux=enhancement) (2BITMUX, null))

The netlist traversal for 2BITMUX 111 is complete. The following is a comparison of the final list above with the list created by traditional means (i.e. manually creating all the "_depletion" schematics netlisted in FIG. 8 120–124):

("pmos" "nmos" "nmos_depletion" "and2_depletion" "and2" "or2_depletion" "or2" "MUX2_depletion" "MUX2" "2BITMUX")

Notice the one-to-one correlation. The data structure may have changed, but the virtual cell mapping function 130 will map every item in the former list to an equivalent in the latter, as if the designer had done it manually.

Note that the present invention allows virtual cells to be used to create a netlist. Thus a netlist can be customized to the needs of a particular tool which will use the netlist as an input. Thus a netlist prepared for a logic simulation tool can be different then a netlist of the exact same circuit prepared for a circuit-simulating tool. Note that virtual cells can refer to real cells (e.g. real cell 133 in FIG. 9) in the database if there are a reasonable number of choices based on attributes. However, virtual cells can stay entirely virtual if there are too many possibilities to be stored in a reasonable fashion in the database.

The present invention can convert a real cell, any real cell, to a virtual cell. As an example, referring to FIG. 8, if MUX2 112 and MUX2_depletion 120 are stored in a the database as real cells, then they may be converted at any point back to a virtual cell MUX2 102. Note that virtual cells can be used at any level of the hierarchical database. Thus either virtual or real cells can call virtual or real cells. Virtual cells can be stored and used as part of an IP (Intellectual Property) repository. Note that the attributes corresponding to a cell can be anything including the number of inputs and outputs, connectivity, enhancement versus depletion mode transistors, threshold voltage, power levels, physical dimensions, component materials, transistor body type, doping, and any other type of attributes or characteristics. Note that the present invention is applicable to any hierarchical database. The present invention allows portions of the hierarchical database to be selectively flattened and hierarchically restructured based on one or more selected attributes.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A netlister stored via a computer readable medium, the netlister comprising:
    a virtual cell mapping function which receives a first cell corresponding to a circuit and an attribute corresponding to the first cell, wherein the virtual cell mapping function maps to a second cell; and
    a first plurality of instructions for instantiating an instance for a child within the second cell, wherein the first plurality of instructions comprise:
        a portion for determining an actual cell of the instance based on the attribute, wherein if the actual cell is virtual, a generated template is used to determine connectivity of the instance, and if the actual cell is real, a template obtained from a database is used to determine connectivity of the instance.

2. The netlister of claim 1, wherein the attribute has a plurality of values, wherein the virtual cell mapping function generates a first virtual cell based on the first cell and a first value of the attribute and generates a second virtual cell based on the first cell and a second value of the attribute, and wherein each of the first and second virtual cells are sections of computer code that programmatically describe the first cell at a level of hierarchy in which each virtual cell resides.

3. The netlister of claim 2, wherein each of the first and second virtual cells comprise one or more of an instance definition function, a template definition function, or a children definition function.

4. The netlister of claim 1, wherein the netlister produces a netlist, and wherein the netlist comprises the database.

5. The netlister of claim 1, wherein the netlister further comprises:
    a second plurality of instructions for storing the second cell in a hierarchical database that describes the circuit.

6. The netlister of claim 1, wherein the attribute is selected from a group consisting of a number of inputs, threshold voltage, power-level, transistor body-type, connectivity, component material, doping, and physical dimension.

7. The netlister of claim 1, wherein the attribute selectively varies connectivity of the first cell.

8. The netlister of claim 7, wherein the attribute selectively varies one of internal connectivity or boundary connectivity.

9. The netlister of claim 1, wherein the virtual cell mapping function selectively creates virtual cells at any level of the hierarchy.

10. The netlister of claim 1, wherein each of the first and second virtual cells is storable in an IP repository.

11. The netlister of claim 1, wherein the virtual cell mapping function receives a second attribute corresponding to the first cell and generates a third cell based on the first cell and the second attribute.

12. A netlister stored via a computer readable medium, the netlister comprising:
- a first portion for providing a virtual cell having a corresponding attribute, wherein the corresponding attribute is capable of having a plurality of attribute values;
- a second portion for providing a first template based on the virtual cell and a first value of the corresponding attribute, said second portion also providing a second template, different from the first template, based on the virtual cell and a second value of the corresponding attribute, wherein the first template is used to programmatically determine connectivity of a first actual cell having the first value of the corresponding attribute, and wherein the second template is used to programmatically determine connectivity of a second actual cell having the second value of the corresponding attribute.

13. The netlister of claim 12, wherein the netlister generates a hierarchical netlist, and wherein the hierarchical netlist is stored in the computer readable medium.

* * * * *